United States Patent
Long et al.

(10) Patent No.: US 10,317,751 B2
(45) Date of Patent: Jun. 11, 2019

(54) PIXEL ARRAY SUBSTRATE HAVING A SEPARATE THIN FILM TRANSISTOR PER PIXEL SUB-REGION, AND DISPLAY DEVICE

(71) Applicant: BOE TECHNOLOGY GROUP CO., LTD., Beijing (CN)

(72) Inventors: Chunping Long, Beijing (CN); Yongda Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/791,376

(22) Filed: Oct. 23, 2017

(65) Prior Publication Data

US 2018/0252969 A1 Sep. 6, 2018

(30) Foreign Application Priority Data

Mar. 3, 2017 (CN) .................... 2017 2 0207711 U

(51) Int. Cl.
*G02F 1/1343* (2006.01)
*G02F 1/1337* (2006.01)
*G02F 1/1362* (2006.01)
*H01L 27/12* (2006.01)
*H01L 29/417* (2006.01)
*H01L 27/32* (2006.01)
*H01L 21/77* (2017.01)
*G02F 1/136* (2006.01)

(52) U.S. Cl.
CPC ...... *G02F 1/134309* (2013.01); *G02F 1/1337* (2013.01); *G02F 1/136209* (2013.01); *G02F 1/136286* (2013.01); *H01L 27/1262* (2013.01); *H01L 27/3248* (2013.01); *H01L 29/41733* (2013.01); *G02F 2001/13606* (2013.01); *H01L 27/3244* (2013.01); *H01L 2021/775* (2013.01)

(58) Field of Classification Search
CPC ......... G02F 1/134309; G02F 1/136209; G02F 1/136286; G02F 1/1337; G02F 2001/13606; H01L 27/3248; H01L 1/1262; H01L 29/41733; H01L 2021/775
See application file for complete search history.

(56) References Cited

U.S. PATENT DOCUMENTS

2007/0153198 A1* 7/2007 Cho ................... G02F 1/134363
349/141
2016/0291367 A1* 10/2016 Cheng ................... G02F 1/1368

* cited by examiner

*Primary Examiner* — Lex H Malsawma
*Assistant Examiner* — Gardner W. S. Swan
(74) *Attorney, Agent, or Firm* — Kinney & Lange, P.A.

(57) ABSTRACT

The present disclosure provides an array substrate and a display device. The array substrate includes: first common electrode lines; gate lines; a gate insulation layer; data lines, the first common electrode lines crossing the data lines to define a plurality of pixel units, each gate line dividing a corresponding pixel unit into two sub-regions, a separate TFT being arranged at each sub-region; second common electrode lines; and a drain electrode pad arranged at each sub-region and a drain electrode connection line for connecting the drain electrode pad to a drain electrode of the TFT. The drain electrode pad, the drain electrode connection line and the drain electrode are arranged at an identical layer. An orthogonal projection of each second common electrode line onto the base substrate overlaps an orthogonal projection of the drain electrode pad onto the base substrate.

15 Claims, 8 Drawing Sheets

PIXEL ARRAY SUBSTRATE HAVING A SEPARATE THIN FILM TRANSISTOR PER PIXEL SUB-REGION, AND DISPLAY DEVICE

CROSS-REFERENCE TO RELATED APPLICATION

The present application claims a priority of the Chinese Patent Application No. 201720207711.5 filed on Mar. 3, 2017, which is incorporated herein by reference in its entirety.

TECHNICAL FIELD

The present disclosure relates to the field of display technology, in particular to an array substrate and a display device.

BACKGROUND

Generally, a Thin Film Transistor-Liquid Crystal Display (TFT-LCD) includes an array substrate, a color filter substrate and a liquid crystal material arranged therebetween. Liquid crystal pixels are driven by TFTs, so as to generate a colorful pattern. The TFTs, pixel electrodes, gate lines and data lines perpendicularly crossing the gate lines are arranged on the array substrate. In order to provide a large-size liquid crystal display with a high resolution and a high display frequency, it is necessary to remarkably increase the number of the gate lines and data lines, shorten a charging time period for each pixel and increase a size of each pixel. At this time, a size of the TFT in each pixel increases too. Hence, uniformity of an analog circuit design for the liquid crystal display as well as the display quality may be adversely affected.

SUMMARY

In one aspect, the present disclosure provides in some embodiments an array substrate, including a plurality of first common electrode lines arranged parallel to each other on a base substrate and spaced apart from each other; a plurality of gate lines each arranged between two adjacent first common electrode lines and parallel to the first common electrode lines; a gate insulation layer covering the first common electrode lines and the gate lines; a plurality of data lines arranged parallel to each other on the gate insulation layer and spaced apart from each other, the first common electrode lines crossing the data lines to define a plurality of pixel units, each gate line dividing a corresponding pixel unit into two sub-regions, a separate thin film transistor (TFT) being arranged at each sub-region; a plurality of second common electrode lines each arranged between one first common electrode line and the adjacent gate line and at a layer identical to the first common electrode lines; and a drain electrode pad arranged at each sub-region and a drain electrode connection line for connecting the drain electrode pad to a drain electrode of the TFT, the drain electrode pad, the drain electrode connection line and the drain electrode being arranged at an identical layer. An orthogonal projection of each second common electrode line onto the base substrate overlaps an orthogonal projection of the drain electrode pad onto the base substrate.

In a possible embodiment of the present disclosure, each second common electrode line is arranged parallel to the first common electrode lines.

In a possible embodiment of the present disclosure, the array substrate further includes: a protection layer covering a source/drain metal layer; and a plurality of pixel electrodes arranged in one-to-one correspondence with the sub-regions and arranged not in contact with each other. Each pixel electrode is electrically connected to the drain electrode of the TFT, an orthogonal projection of each pixel electrode onto the base substrate is at least partially located with an orthogonal projection of the sub-region onto the base substrate, a via-hole is formed in the protection layer so as to expose the drain electrode pad, and each pixel electrode is connected to the corresponding drain electrode pad through the via-hole.

In a possible embodiment of the present disclosure, the orthogonal projection of each pixel electrode onto the base substrate overlaps orthogonal projections of the data lines at both sides of the pixel electrode onto the base substrate.

In a possible embodiment of the present disclosure, each data line includes a plurality of first segment portions perpendicular to the first common electrode line, a plurality of second segment portions perpendicular to the first common electrode lines, and a plurality of third segment portions each connecting the corresponding first segment portion and the corresponding second segment portion. With respect to each data line, each first segment portion spans over two adjacent pixel units, and two ends of the first segment portion are respectively located at two sides of the first common electrode line over which the first segment portion spans; an orthogonal projection of each first segment portion onto the base substrate overlaps an orthogonal projection of the pixel electrode of each pixel unit at a side of the corresponding data line onto the base substrate; each second segment portion spans over a corresponding gate line crossing a corresponding data line, and two ends of the second segment portion are respectively located at two sides of the gate line; and an orthogonal projection of each second segment portion onto the base substrate overlaps an orthogonal projection of the pixel electrode of each pixel unit at another side of the data line onto the base substrate.

In a possible embodiment of the present disclosure, each third segment portion is angled relative to the corresponding second common electrode line, and the corresponding third segment portions at two ends of each second segment portion is arranged symmetrically relative to the corresponding gate line over which the second segment portion spans.

In a possible embodiment of the present disclosure, an orthogonal projection of each third segment portion onto the base substrate is located within an orthogonal projection of the corresponding second common electrode line onto the base substrate.

In a possible embodiment of the present disclosure, the array substrate further includes a common electrode connection line arranged within at least one pixel unit. The common electrode connection line is arranged at a layer identical to the first common electrode lines and the second common electrode lines and connects the corresponding second common electrode line to the adjacent first common electrode line, and the common electrode connection line within the at least one pixel unit is located at one or two sub-regions.

In a possible embodiment of the present disclosure, the protection layer includes a passivation layer, an organic material planarization layer, or both.

In a possible embodiment of the present disclosure, active layers of the TFTs are separated from each other.

In a possible embodiment of the present disclosure, the two sub-regions of each pixel unit divided by the gate line have an identical area.

In a possible embodiment of the present disclosure, a plurality of gate electrodes extends from two sides of each gate line and is located at the sub-regions respectively, each gate line is provided with a plurality of hollowed-out portions, and each hollowed-out portion is located between two gate electrodes opposite to each other, and extends to be below the corresponding data line crossing the gate line.

In a possible embodiment of the present disclosure, the drain electrode pad has a width greater than or equal to the drain electrode and the drain electrode connection line, and/or the drain electrode pad has a width equal to the second common electrode line.

In another aspect, the present disclosure provides in some embodiments a display device including the above-mentioned array substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

Figure 1:
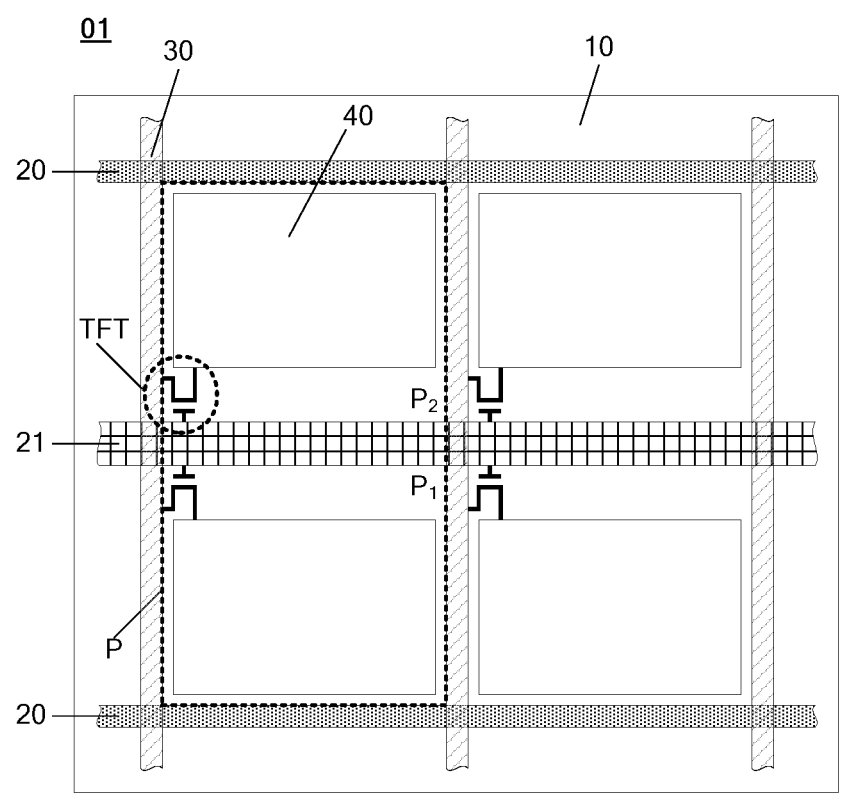
FIG. 1 is a top view of an array substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. It should be appreciated that, those terms having common meanings defined in a dictionary shall be construed as having an identical meaning in the context, but shall not be interpreted idealistically and extremely. For example, such words as "first" and "second" used in the specification and claims are merely used to differentiate different components rather than to represent any order, number or importance. Such words as "comprise" and "include" are used to indicate that an element or item before the words covers element(s) or item(s) or equivalents thereof listed hereinafter, with any other elements or items being not excluded. Such words as "on/above", "under/below", "left", "right", "row direction" and "column direction" are used to indicate directions or positions as viewed in the drawings, and they are merely used to facilitate the description in the present disclosure, rather than to indicate or imply that a device or member must be arranged or operated at a specific position. For example, in some cases, the embodiments where the row direction is involved may also be implemented in the case of the column direction, and vice versa.

In addition, a structure of an array substrate involved in the embodiments of the present disclosure, e.g., a TFT, has a very small size, and for clarification, the size of each structure in the drawings has been enlarged, rather than to reflect an actual size or scale.

As shown in FIG. 1, the present disclosure provides in some embodiments an array substrate 01, which includes: a plurality of first common electrode lines 20 arranged parallel to each other on a base substrate 10 and spaced apart from each other; a plurality of gate lines 21 each arranged between two adjacent first common electrode lines 20 and parallel to the first common electrode lines 20; a gate insulation layer covering the first common electrode lines 20 and the gate lines 21 (the gate insulation layer is usually made of a transparent material, so it is not shown in FIG. 1); and a plurality of data lines 30 arranged parallel to each other on the gate insulation layer and spaced apart from each other. Each data line may be arranged perpendicular to the first common electrode lines 20 and the gate lines 21. The first common electrode lines 20 cross the data lines 30 to define a plurality of pixel units P, and each gate line 21 is configured to divide a corresponding pixel unit into two sub-regions (P1 and P2, where the subscripts "1" and "2" are merely used to differentiate the sub-regions from each other, rather than to define positions of the sub-regions). A separate TFT is arranged at each sub-region. It should be appreciated that, FIG. 1 merely shows two pixel units P, and the number of the pixel units on the array substrate 01 may be set according to a size of a display device, which will not be particularly defined herein.

In each pixel unit P, the two sub-regions divided by the corresponding gate line 21 may have an identical area or different areas. Considering the light-emission uniformity of the sub-regions of each pixel unit, in some embodiments of the present disclosure, the sub-regions of each pixel unit may have an identical area, i.e., a distance between the gate line 21 and one of two adjacent first common electrode lines 20 is equal to a distance between the gate line 21 and the other one of the two adjacent first common electrode lines 20.

One of the first common electrode lines 20 is arranged at an edge portion of each sub-region (e.g., an edge portion substantially parallel to the gate line) and parallel to the corresponding gate line 21, so as to separate pixel electrodes 40 of two adjacent pixel units P from each other, thereby to prevent the occurrence of light leakage due to the lack of a modulation electric field at a region between the two adjacent pixels.

Each first common electrode line 20 may be made of a material, and have a thickness, identical to the gate line 21, and they may be formed through a single patterning process.

According to the array substrate 01 in the embodiments of the present disclosure, each pixel unit P includes two separate sub-regions P1 and P2, and a display signal is applied to each sub-region through a corresponding pixel electrode 40, the two pad pixel electrodes 40 are discontinuous, divided by the gate line 20 and not directly electrically connected to each other. The pixel electrodes corresponding to the two sub-regions P1 and P2 in each pixel unit P are controlled by two separate TFTs respectively.

In this way, as compared with the related art where the entire pixel region is controlled by a large-size TFT or TFTs connected parallel to each other, a smaller pixel region is provided in the embodiments of the present disclosure and controlled separately by a small-size TFT. As a result, it is able to improve the uniformity of an analog circuit design after the array substrate 01 with the above-mentioned pixel design to the display device, and improve the brightness uniformity of each sub-region as compared with each pixel unit in the related art.

In addition, in the embodiments of the present disclosure, because each pixel unit P of the array substrate 01 consists of two separate sub-regions P1 and P2, the TFT at one region of the pixel unit P may still work normally in the case that the abnormality occurs for the TFT at the other region. As a result, it is able to ensure the normal display of the pixel unit P.

Further, active layers a of the TFTs are separated from each other. The array substrate 01 further includes the pixel electrodes 40 arranged in one-to-one correspondence with the sub-regions and arranged not in contact with each other. Each pixel electrode 40 is electrically connected to a drain electrode of the corresponding TFT, and at least a portion of each pixel electrode 40 is located at the corresponding sub-region.

Here, in the case that the pixel electrodes 40 are arranged in one-to-one correspondence with the sub-regions and arranged not in contact with each other, it means that each sub-region is provided with a corresponding pixel electrode 40 (i.e., a plurality of pixel electrodes 40 are provided on the array substrate 01), and these pixel electrodes 40 are not in contact with each other.

Figure 2:
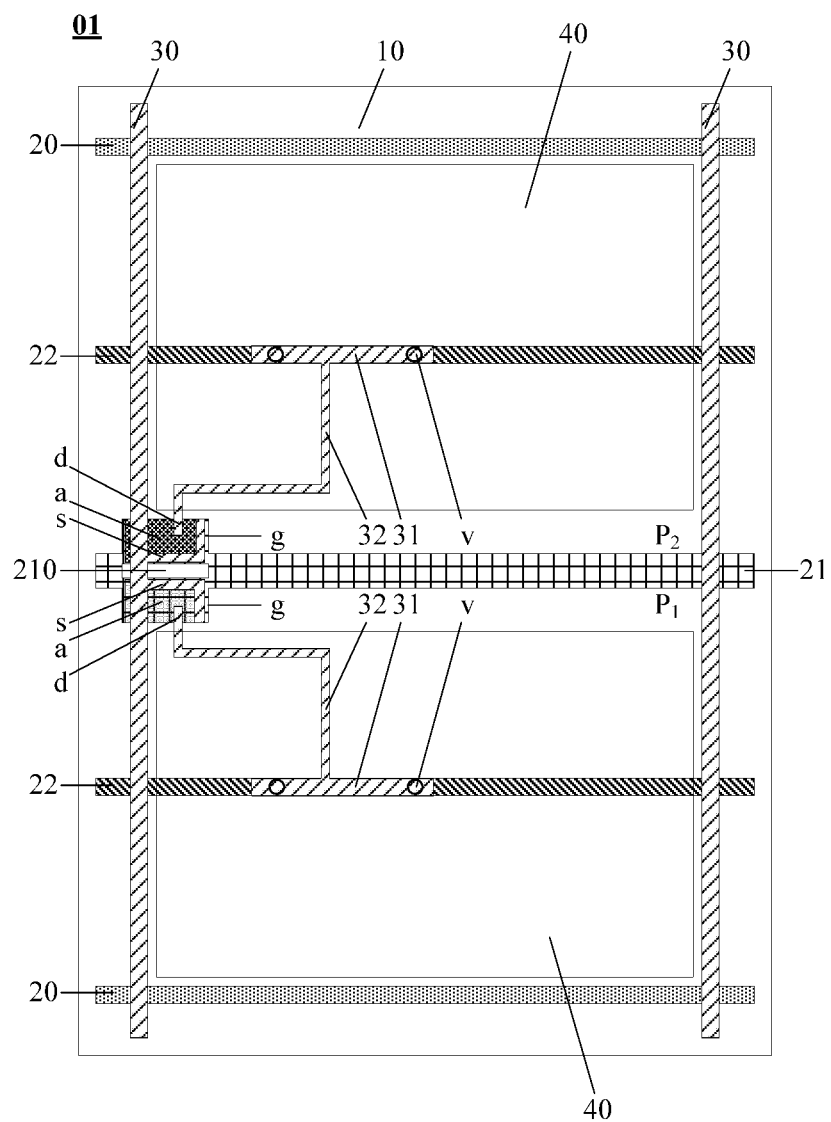
FIG. 2 is another top view of the array substrate according to one embodiment of the present disclosure.

To be specific, as shown in FIG. 2, the TFT at each sub-region includes a gate electrode g, the active layer a, a source electrode s and the drain electrode d which are separated from each other. The TFTs of each pixel unit are controlled by the gate electrodes g which are separated from each other but electrically connected to an identical gate line 21. The source electrodes s and the drain electrodes d of the TFTs of each pixel unit are arranged at two adjacent sub-regions divided by the corresponding gate line 21, and the source electrodes s of the TFTs are electrically connected to an identical data line 30, so as to receive a corresponding data signal.

As shown in FIG. 2, the array substrate 01 further includes: a plurality of second common electrode lines 22 each arranged between one first common electrode line 20 and the adjacent gate line 21 and at a layer identical to the first common electrode lines 20; and a drain electrode pad 31 arranged at each sub-region and a drain electrode connection line 32 for connecting the drain electrode pad 31 to a drain electrode d of the TFT. The drain electrode pad 31, the drain electrode connection line 32 and the drain electrode d are arranged at an identical layer. An orthogonal projection of each second common electrode line 22 onto the base substrate overlaps an orthogonal projection of the drain electrode pad 31 onto the base substrate.

It should be appreciated that, the so-called "arranged at an identical layer" refers to the arrangement of at least two patterns at an identical layer. To be specific, the at least two patterns may be formed on thin films made of an identical material through one patterning process.

For example, the second common electrode lines 22 and the first common electrode lines 20 may be arranged on the base substrate 10, made of an identical material and have an identical thickness.

In addition, each second common electrode line 22 may be arranged parallel to the first common electrode lines 20, so as to reduce the wiring difficulty of the array substrate.

Identically, the drain electrode pads 31, the drain electrode connection lines 32 and the drain electrodes d may be arranged at an identical layer. To be specific, the drain electrode pads 31, the drain electrode connection lines 32, the drain electrodes d and the source electrodes s of the TFTs, and the data lines 30 connected to the source electrodes s may be arranged on the gate insulation layer, made of an identical material and have an identical thickness.

Each drain electrode pad 31 is of a substantially rectangular shape and formed on the corresponding second common electrode line 22 at a substantially central position of each sub-region. The corresponding drain electrode connection line 32 arranged at a layer identical to the drain electrode pad 31 may pass through the sub-region of the pixel unit P, and two ends thereof are connected to the drain electrode d of the corresponding TFT and the drain electrode pad 31 serving as an upper electrode of a storage capacitor respectively.

One corresponding second common electrode line 22 may pass through each sub-region at the substantially central position of the sub-region and may be arranged parallel to the corresponding gate line 21. An orthogonal projection of the second common electrode line 22 onto the base substrate 10 overlaps an orthogonal projection of the drain electrode pad 31 onto the base substrate 10, so the second common electrode line 22 forms another electrode of the storage capacitor.

In other words, according to the above-mentioned pixel design, the storage capacitor at each sub-region consists of the gate insulation layer between the gate line 21 and the data line 30 and metal electrodes at two ends thereof. As compared with the related art where the storage capacitor is formed by the gate insulation layer between the pixel electrode and the gate line and the passivation layer, in the embodiments of the present disclosure, an insulation layer of the storage capacitor of the array substrate 01 merely includes the gate insulation layer, so it is able to provide a thinner insulating medium and a larger capacitance. In addition, a width of the separate drain electrode pad 31 and a width of a portion of the second common electrode line 22 at each sub-region may be set flexibly, so it is able to further increase the capacitance of the storage capacitor.

Here, the width of the drain electrode pad 31 may be greater than or equal to a width of each of the drain electrode d and the drain electrode connection line 32, and substantially equal to a width of the second common electrode line 22 serving as a lower electrode of the storage capacitor, so as to further increase an area of an overlapping region between the drain electrode pad 31 and the second common electrode line 22, thereby to increase the capacitance of the storage capacitor.

For example, the gate line 21 may have a width of 2 to 50 µm, each of the first common electrode line 20 and the second common electrode line 22 may have a width of 2 to 30 µm, the data line 30 may have a width of 2 to 20 µm, the drain electrode pad 31 may have a width of 2 to 30 μm, and/or each of the drain electrode d and the drain electrode connection line 32 may have a width of 2 to 10 μm.

Further, as shown in FIG. 2, the plurality of gate electrodes g extends from two sides of each gate line 21 and is located at the sub-regions respectively. Each gate line 21 is provided with a plurality of hollowed-out portions 210, and each hollowed-out portion 210 is located between two gate electrodes g opposite to each other, and extends to be below the corresponding data line 30 crossing the gate line 21.

In other words, each gate line 21 includes two branches which are arranged at regions corresponding to the TFTs at the sub-regions and which are electrically connected to a main portion of the gate line 21, so as to form the gate electrodes g of the TFTs. The two branches may be arranged substantially parallel to the main portion of the gate line 21, and the hollowed-out portion 210 may be formed between the two branches. Two active layers a made of a semiconductor material may be formed on the two branches of each gate line 21, and the two active layers a are separated by the hollowed-out portion 210. The active layer a may have a width and a length substantially approximate to those of the gate electrode g. The source electrode s and the drain electrode d of each TFT may be formed on the active layer a. The source electrodes s of the TFTs may be electrically connected to the corresponding data line 30, and the drain electrodes d may be electrically connected to the pixel electrode 40 at each sub-region.

In the case that each gate line 21 is provided with the hollowed-out portion 210, it is able to, on one hand, reduce the parasitic capacitor generated due to the overlapping of the gate line 21 and the data line 30. On the other hand, in the case that the abnormality occurs for the TFT at one sub-region, the hollowed-out portion 210 of the gate line 21 may serve as a mark for laser cutting, i.e., the gate line 21 may be cut at the hollowed-out portion so as to separate the two gate electrodes g located at the two adjacent sub-regions and extending from the gate line 21 from each other. As a result, it is able to prevent the TFT at the other sub-region controlled by the same gate line 21 from being adversely affected by the abnormal TFT.

Here, each of the gate electrodes g extending from the same gate line 21 may have a width of, e.g., 2 to 10 μm, and/or a length of, e.g., 2 to 20 μm. The length of the gate electrode g refers to a size of the gate electrode g in a direction parallel to the gate line 21, and the width of the gate electrode g refers to a size of the gate electrode g in a direction perpendicular to the gate line 21.

As shown in FIG. 2, the array substrate 01 further includes a protection layer (which is usually made of a transparent material) covering a source/drain metal layer including the data lines 30. Via-holes v are formed in the protection layer so as to expose the drain electrode pads 31, and each pixel electrode 40 is connected to the corresponding drain electrode pad 31 through the corresponding via-hole v.

In a possible embodiment of the present disclosure, two opposite via-holes v are formed above each drain electrode pad 31, so as to facilitate the connection between the pixel electrode 40 and the drain electrode pad 31.

In addition, the material and the number of the protection layer will not be particularly defined herein. For example, the protection layer may be a passivation layer, or an organic material planarization layer, or both of them one on another.

Further, in order to reduce resistances of the first common electrode lines 20 and the second common electrode lines 22 and improve the uniformity of a common voltage, the array substrate 01 further includes a common electrode connection line arranged within at least one pixel unit P. The common electrode connection line is arranged at a layer identical to the first common electrode lines 20 and the second common electrode lines 22 and connects the corresponding second common electrode line 22 to the adjacent first common electrode line 20. The common electrode connection line within the at least one pixel unit P is located at one or two sub-regions.

In other words, at least one pixel unit P may be provided with the common electrode connection line for connecting the corresponding second common electrode line 22 to the adjacent first common electrode line 20, and the common electrode connection line may be arranged at one or two sub-regions of the pixel unit P.

In some embodiments of the present disclosure, the orthogonal projection of each pixel electrode 40 onto the base substrate overlaps orthogonal projections of the data lines 30 at both sides of the pixel electrode 40 onto the base substrate, so as to form the parasitic capacitors between the pixel electrodes 40 at the sub-regions and the adjacent data line 30, thereby to effectively reduce the occurrence of cross-talk. In addition, the pixel electrodes 40 cover the corresponding data line 30, so as to form the modulation electric field and prevent the occurrence of light leakage. Further a black matrix may also be arranged on a color filter opposite to the array substrate to cover a region between folded portions of the data lines, so as to completely prevent the occurrence of light leakage between the adjacent pixel units.

Figure 3:
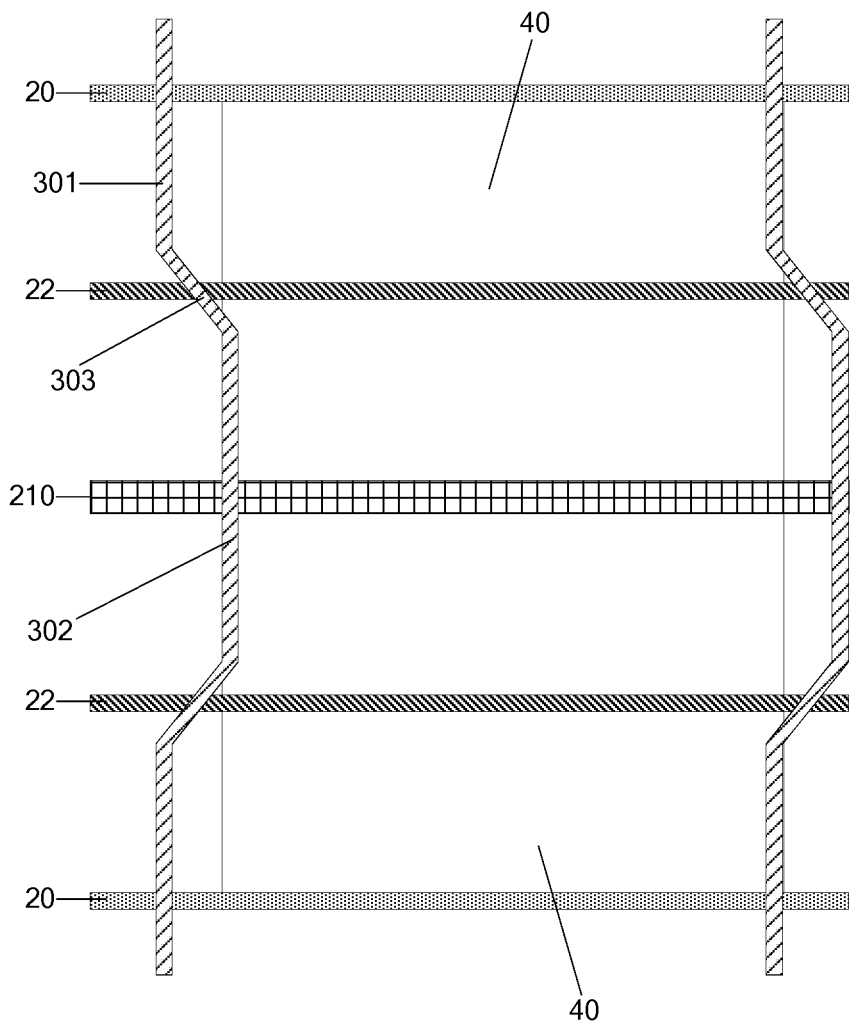
FIG. 3 is yet another top view of the array substrate according to one embodiment of the present disclosure.

For example, FIG. 3 (which merely shows a part of structures of the array substrate) shows the data lines 30 with folded portions. Each data line 30 includes a plurality of first segment portions 301 perpendicular to the first common electrode line 20, a plurality of second segment portions 302 perpendicular to the first common electrode lines 20, and a plurality of third segment portions 303 each connecting the corresponding first segment portion 301 and the corresponding second segment portion 302. With respect to each data line 30, each first segment portion 301 spans over two adjacent pixel units, and two ends of the first segment portion 301 are respectively located at two sides of the first common electrode line 20 over which the first segment portion 301 spans; an orthogonal projection of each first segment portion 301 onto the base substrate overlaps an orthogonal projection of the pixel electrode 40 of each pixel unit at a side of the corresponding data line 30 onto the base substrate; each second segment portion 302 spans over a corresponding gate line 21 crossing a corresponding data line 30, and two ends of the second segment portion 302 are respectively located at two sides of the gate line 21; and an orthogonal projection of each second segment portion 302 onto the base substrate overlaps an orthogonal projection of the pixel electrode 40 of each pixel unit at another side of the data line 30 onto the base substrate.

Each third segment portion 303 may be arranged parallel to the second common electrode line 22 or angled relative to the second common electrode line 22 (e.g., oblique to the second common electrode line 22 as shown in the figure). In addition, the third segment portions 303 at two ends of each second segment portion 302 may be arranged symmetrically.

The array substrate 01 will be described hereinafter in more details.

Figure 4:
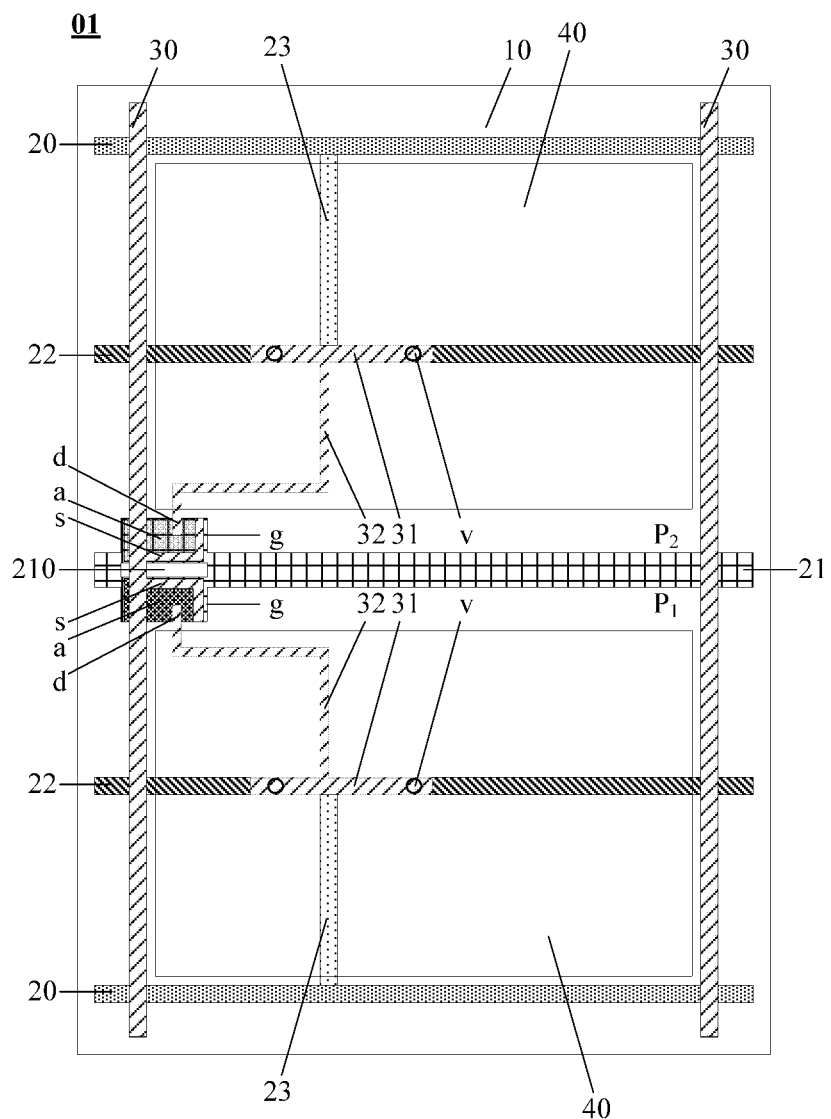
FIG. 4 is still yet another top view of the array substrate according to one embodiment of the present disclosure.

In some embodiments of the present disclosure, as shown in FIG. 4, the array substrate 01 includes: the first common electrode lines 20, the second common electrode lines 22, the common electrode connection line 23 and the gate lines 21 arranged on the base substrate 10; the gate insulation layer covering the above lines; and the data lines 30 arranged parallel to each other on the gate insulation layer and spaced apart from each other. The first common electrode lines 20 are arranged parallel to and spaced apart from each other, and each of them has a width of 2 to 30 μm. Each gate line 21 is arranged between every two adjacent first common electrode lines 20 and parallel to the first common electrode lines 20, and has a width of 2 to 50 μm. Each second common electrode line 22 is arranged between one of the first common electrode lines 20 and the adjacent gate line 21 and parallel to the first common electrode lines 20, and has a width of 2 to 30 μm. A lengthwise direction of the data line 30 is perpendicular to the first common electrode lines 20. The first common electrode lines 20 cross the data lines 30 to define the plurality of pixel units P. Each pixel unit P is divided by the gate line 21 located at a substantially central position of the corresponding pixel unit P into two sub-regions P1 and P2 with a substantially identical area. The common electrode connection line 23 is arranged at each sub-region of the pixel unit P and configured to connect the second common electrode line 22 and the adjacent first common electrode line 20. The common electrode connection line 23 may be perpendicular to the first common electrode line 20 and the second common electrode line 22.

The TFT is arranged at each sub-region. Each gate line 21 includes two branches located at regions corresponding to the TFTs at the sub-regions and electrically connected to the main portion of the gate line 21, so as to form the gate electrodes g of the TFTs. Each gate electrode g may have a width of 2 to 10 μm, and a length of 2 to 20 μm. The two branches may be arranged substantially parallel to the main portion of the gate line 21, and the hollowed-out portion 210 may be arranged between the two branches.

The two active layers a made of a semiconductor material are arranged on the two branches of the gate line 21 respectively. Each active layer a is separated by the hollowed-out portion 210 on each branch. The active layer a has a width and a length substantially approximate to those of the gate electrode g. The source electrodes s and the drain electrodes d of the TFTs are formed on the active layers a respectively, and the source electrodes s are electrically connected to the data lines 30.

Each sub-region is further provided with the drain electrode pad 31 arranged at a layer identical to the data line 30, the source electrode s and the drain electrode d, and the drain electrode connection lien 32 connected to the drain electrode pad 31 and the drain electrode d of the TFT. The drain electrode pad 31 is of a substantially rectangular shape, and arranged above the second common electrode line 22 at the substantially central position of each sub-region. The storage capacitor of each sub-region is formed at a region where the drain electrode pad 31 overlaps the second common electrode line 22.

The drain electrode pad 31 has a width of 2 to 30 μm, and each of the drain electrode d and the drain electrode connection line 32 has a width of 2 to 10 μm. In addition, in order to prevent an aperture ratio of the array substrate from being adversely affected by the non-transparent drain electrode d and drain electrode connection line 32, the width of the drain electrode pad 31 may be greater than the width of each of the drain electrode d and the drain electrode connection line 32.

The array substrate 01 further includes the protection layer covering the source/drain metal layer including the data lines 30, and the pixel electrodes 40 each arranged at the corresponding sub-region. The via-holes v are formed in the protection layer so as to expose the drain electrode pads 31, and each pixel electrode 40 is connected to the corresponding drain electrode pad 31 through the corresponding via-hole v.

In the embodiments of the present disclosure, the gate lines 21, the gate electrodes g extending from the gate lines 21, the data lines 30, the source electrodes s extending from the data lines 30, the drain electrodes d each arranged opposite to the corresponding source electrode s, the drain electrode pads 31, the drain electrode connection lines 32, the first common electrode lines 20, the second common electrode lines 22 and the common electrode connection line 23 may be made of Cu, Al, Mo, Ti, Cr, W, Nd or Nb, or an alloy thereof.

Each of the above metal lines may be of a single-layered structure, or a multi-layered structure such as Mo/Al/Mo, Ti/Al/Ti, Ti/Cu/Ti or Mo/Cu/Ti. The lines arranged at an identical layer, e.g., the first common electrode lines 20, the second common electrode lines 22, the common electrode connection line 23 and the gate lines 21, may be made of an identical material and have an identical thickness.

Each active layer a may be made of amorphous silicon, low-temperature polycrystalline silicon, or an oxide semiconductor material.

Each insulation layer, e.g., the gate insulation layer, may be made of silicon nitride or silicon oxide. It may be of a single-layered structure, or a multi-layered structure such as silicon oxide/silicon nitride. The protection layer may include the passivation layer and/or the organic material planarization layer. The passivation layer may be made of an inorganic material, such as silicon nitride, and the organic material planarization layer may be made of an organic material such as resin.

Each pixel electrode 40 may be made of a transparent metal oxide conductive material such as indium tin oxide (ITO), indium zinc oxide (IZO) or indium tin zinc oxide (ITZO).

Through the above design, each pixel unit includes two separate TFTs, and the separate active layers are controlled by the separate gate electrodes respectively, so as to form conductive channels. The TFT at each sub-region includes the separate source electrode and the separate drain electrode. The gate electrodes of the TFTs in the pixel units in each row are connected to an identical gate line, and the source electrodes of the TFTs in the pixel units in each column are connected to an identical data line. Each pixel unit is divided by the corresponding gate line into two sub-regions, each of which is provided with the discontinuous pixel electrode. As a result, it is able to reduce the parasitic capacitor, and increase the storage capacitor by increasing the widths of the drain electrode pads and the portions of the second common electrode lines below the drain electrode pads, thereby to prevent a pixel voltage from being changed due to the existence of a feed-through voltage.

As shown in FIG. 2, the array substrate 01 includes: the first common electrode lines 20, the second common electrode lines 22 and the gate lines 21 arranged on the base substrate 10; the gate insulation layer covering the above lines; and the data lines 30 arranged parallel to each other on the gate insulation layer and spaced apart from each other. The first common electrode lines 20 are arranged parallel to and spaced apart from each other, and each of them has a width of 2 to 30 μm. Each gate line 21 is arranged between every two adjacent first common electrode lines 20 and parallel to the first common electrode lines 20, and has a width of 2 to 50 μm. Each second common electrode line 22 is arranged between one of the first common electrode lines 20 and the adjacent gate line 21 and parallel to the first common electrode lines 20, and has a width of 2 to 30 μm. A lengthwise direction of the data line 30 is perpendicular to the first common electrode lines 20. The first common electrode lines 20 cross the data lines 30 to define the plurality of pixel units P. Each pixel unit P is divided by the gate line 21 located at a substantially central position of the corresponding pixel unit P into two sub-regions P1 and P2 with a substantially identical area.

The TFT is arranged at each sub-region. Each gate line 21 includes two branches located at regions corresponding to the TFTs at the sub-regions and electrically connected to the main portion of the gate line 21, so as to form the gate electrodes g of the TFTs. Each gate electrode g may have a width of 2 to 10 μm, and a length of 2 to 20 μm. The two branches may be arranged substantially parallel to the main portion of the gate line 21, and the hollowed-out portion 210 may be arranged between the two branches.

The two active layers a made of a semiconductor material are arranged on the two branches of the gate line 21 respectively. Each active layer a is separated by the hollowed-out portion 210 on each branch. The active layer a has a width and a length substantially approximate to those of the gate electrode g. The source electrodes s and the drain electrodes d of the TFTs are formed on the active layers a respectively, and the source electrodes s are electrically connected to the data lines 30.

Each sub-region is further provided with the drain electrode pad 31 arranged at a layer identical to the data line 30, the source electrode s and the drain electrode d, and the drain electrode connection lien 32 connected to the drain electrode pad 31 and the drain electrode of the TFT. The drain electrode pad 31 is of a substantially rectangular shape, and arranged above the second common electrode line 22 at the substantially central position of each sub-region. The storage capacitor of each sub-region is formed at a region where the drain electrode pad 31 overlaps the second common electrode line 22.

The drain electrode pad 31 has a width of 2 to 30 μm, and each of the drain electrode d and the drain electrode connection line 32 has a width of 2 to 10 μm. In addition, in order to prevent an aperture ratio of the array substrate from being adversely affected by the non-transparent drain electrode d and drain electrode connection line 32, the width of the drain electrode pad 31 may be greater than the width of each of the drain electrode d and the drain electrode connection line 32.

The array substrate 01 further includes the protection layer covering the source/drain metal layer including the data lines 30, and the pixel electrodes 40 each arranged at the corresponding sub-region. The via-holes v are formed in the protection layer so as to expose the drain electrode pads 31, and each pixel electrode 40 is connected to the corresponding drain electrode pad 31 through the corresponding via-hole v.

In the embodiments of the present disclosure, the gate lines 21, the gate electrodes g extending from the gate lines 21, the data lines 30, the source electrodes s extending from the data lines 30, the drain electrodes d each arranged opposite to the corresponding source electrode s, the drain electrode pads 31, the drain electrode connection lines 32, the first common electrode lines 20, and the second common electrode lines 22 may be made of Cu, Al, Mo, Ti, Cr, W, Nd or Nb, or an alloy thereof.

Each of the above metal lines may be of a single-layered structure, or a multi-layered structure such as Mo/Al/Mo, Ti/Al/Ti, Ti/Cu/Ti or Mo/Cu/Ti. The lines arranged at an identical layer, e.g., the first common electrode lines 20, the second common electrode lines 22 and the gate lines 21, may be made of an identical material and have an identical thickness.

Each active layer a may be made of amorphous silicon, low-temperature polycrystalline silicon, or an oxide semiconductor material.

Each insulation layer, e.g., the gate insulation layer, may be made of silicon nitride or silicon oxide. It may be of a single-layered structure, or a multi-layered structure such as silicon oxide/silicon nitride. The protection layer may include the passivation layer and/or the organic material planarization layer. The passivation layer may be made of an inorganic material, such as silicon nitride, and the organic material planarization layer may be made of an organic material such as resin.

Each pixel electrode 40 may be made of a transparent metal oxide conductive material such as ITO, IZO or ITZO.

Through the above design, each pixel unit includes two separate TFTs, and the separate active layers are controlled by the separate gate electrodes respectively, so as to form conductive channels. The TFT at each sub-region includes the separate source electrode and the separate drain electrode. The gate electrodes of the TFTs in the pixel units in each row are connected to an identical gate line, and the source electrodes of the TFTs in the pixel units in each column are connected to an identical data line. Each pixel unit is divided by the corresponding gate line into two sub-regions, each of which is provided with the discontinuous pixel electrode. As a result, it is able to reduce the parasitic capacitor, and increase the storage capacitor by increasing the widths of the drain electrode pads and the portions of the second common electrode lines below the drain electrode pads, thereby to prevent a pixel voltage from being changed due to the existence of a feed-through voltage.

Figure 5:
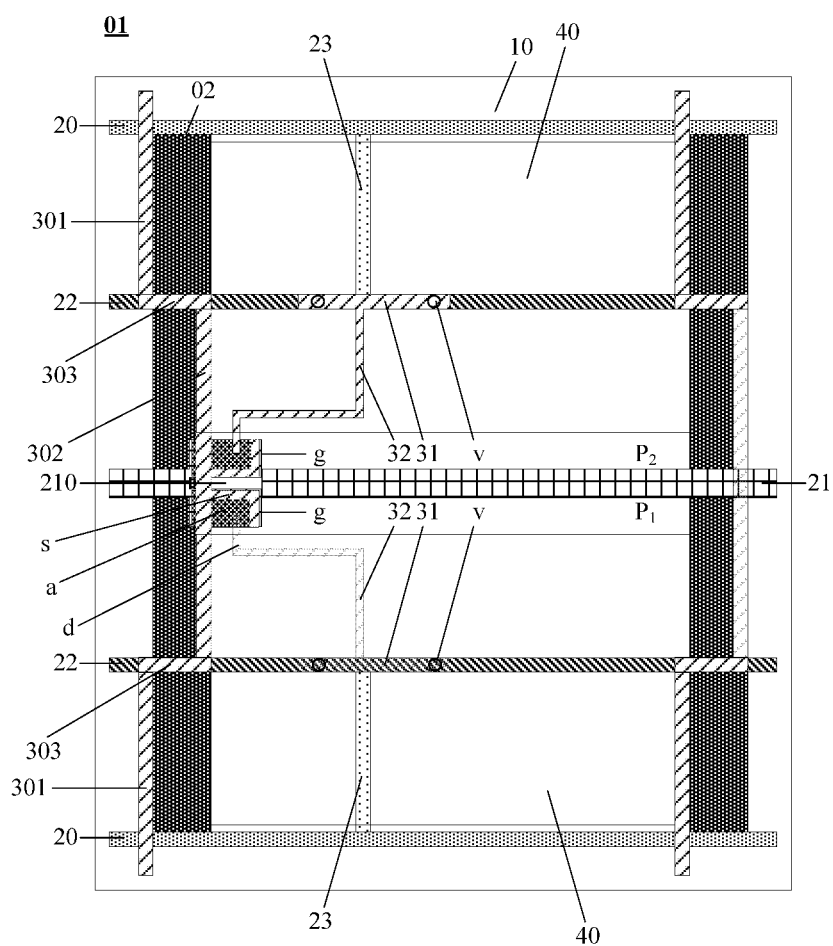
FIG. 5 is still yet another top view of the array substrate according to one embodiment of the present disclosure.

As shown in FIG. 5, the array substrate 01 includes: the first common electrode lines 20, the second common electrode lines 22, the common electrode connection line 23 and the gate lines 21 arranged on the base substrate 10; the gate insulation layer covering the above lines; and the data lines 30 arranged parallel to each other on the gate insulation layer and spaced apart from each other. The first common electrode lines 20 are arranged parallel to and spaced apart from each other, and each of them has a width of 2 to 30 μm. Each gate line 21 is arranged between every two adjacent first common electrode lines 20 and parallel to the first common electrode lines 20, and has a width of 2 to 50 μm. Each second common electrode line 22 is arranged between one of the first common electrode lines 20 and the adjacent gate line 21 and parallel to the first common electrode lines 20, and has a width of 2 to 30 μm. A lengthwise direction of the data line 30 is perpendicular to the first common electrode lines 20. The first common electrode lines 20 cross the data lines 30 to define the plurality of pixel units P. Each pixel unit P is divided by the gate line 21 located at a substantially central position of the corresponding pixel unit P into two sub-regions P1 and P2 with a substantially identical area. The common electrode connection line 23 is arranged at each sub-region of the pixel unit P and configured to connect the second common electrode line 22 and the adjacent first common electrode line 20. The common electrode connection line 23 may be perpendicular to the first common electrode line 20 and the second common electrode line 22.

The TFT is arranged at each sub-region. Each gate line 21 includes two branches located at regions corresponding to the TFTs at the sub-regions and electrically connected to the main portion of the gate line 21, so as to form the gate electrodes g of the TFTs. Each gate electrode g may have a width of 2 to 10 μm, and a length of 2 to 20 μm. The two branches may be arranged substantially parallel to the main portion of the gate line 21, and the hollowed-out portion 210 may be arranged between the two branches.

The two active layers a made of a semiconductor material are arranged on the two branches of the gate line 21 respectively. Each active layer a is separated by the hollowed-out portion 210 on each branch. The active layer a has a width and a length substantially approximate to those of the gate electrode g. The source electrodes s and the drain electrodes d of the TFTs are formed on the active layers a respectively, and the source electrodes s are electrically connected to the data lines 30.

Each sub-region is further provided with the drain electrode pad 31 arranged at a layer identical to the data line 30, the source electrode s and the drain electrode d, and the drain electrode connection lien 32 connected to the drain electrode pad 31 and the drain electrode of the TFT. The drain electrode pad 31 is of a substantially rectangular shape, and arranged above the second common electrode line 22 at the substantially central position of each sub-region. The storage capacitor of each sub-region is formed at a region where the drain electrode pad 31 overlaps the second common electrode line 22.

The drain electrode pad 31 has a width of 2 to 30 μm, and each of the drain electrode d and the drain electrode connection line 32 has a width of 2 to 10 μm. In addition, in order to prevent an aperture ratio of the array substrate from being adversely affected by the non-transparent drain electrode d and drain electrode connection line 32, the width of the drain electrode pad 31 may be greater than the width of each of the drain electrode d and the drain electrode connection line 32.

The array substrate 01 further includes the protection layer covering the source/drain metal layer including the data lines 30, and the pixel electrodes 40 each arranged at the corresponding sub-region. The via-holes v are formed in the protection layer so as to expose the drain electrode pads 31, and each pixel electrode 40 is connected to the corresponding drain electrode pad 31 through the corresponding via-hole v.

Each data line 30 whose lengthwise direction is perpendicular to the gate line 21 is a folded line. Each data line 30 includes the plurality of first segment portions 301 perpendicular to the first common electrode line 20, the plurality of second segment portions 302 perpendicular to the first common electrode lines 20, and the plurality of third segment portions 303 each connecting the corresponding first segment portion 301 and the corresponding second segment portion 302. With respect to each data line 30, each first segment portion 301 spans over two adjacent pixel units P, and two ends of the first segment portion 301 are respectively located above two adjacent second common electrode lines 22 in the two adjacent pixel units P over which the first segment portion 301 spans; an orthogonal projection of each first segment portion 301 onto the base substrate 10 overlaps an orthogonal projection of the pixel electrode 40 of each pixel unit P at a side of the corresponding data line 30 onto the base substrate 10; each second segment portion 302 spans over the two sub-regions in one pixel unit p, and two ends of the second segment portion 302 are respectively located above the two adjacent second common electrode lines 22 at the two sub-regions; and an orthogonal projection of each second segment portion 302 onto the base substrate 10 overlaps an orthogonal projection of the pixel electrode 40 of each pixel unit P at another side of the data line 30 onto the base substrate. Each segment portion of the data line 30 has a width of 2 to 20 μm.

Here, each third segment portion 303 connecting the first segment portion 301 and the second segment portion 302 may be a straight line perpendicular to, or oblique to, the first segment portion 301 and the second segment portion 302, or a curved line. In order to prevent the aperture ratio of the pixel unit from being adversely affected by the non-transparent data line 30, in some embodiments of the present disclosure, each third segment portion 303 is arranged right above the second common electrode line 22, i.e., an orthogonal projection of the third segment portion onto the base substrate is located within the orthogonal projection of the second common electrode line onto the base substrate.

The data lines 30 are curved toward an identical direction. In FIG. 5, all the data lines 30 are curved to the right. Between the two data lines at two sides of the pixel units in one column, the pixel electrode 40 at each sub-region covers the second segment portion 302 of the data line 30 at one side (i.e., at the left side), but does not cover the first segment portion 301 of the data line 302. In addition, the pixel electrode 40 at each sub-region of each pixel units in the column covers the first segment portion 301 of the data line at the other side (i.e., the right side), but does not cover the second segment portion 302 of the data line 30.

It should be appreciated that, FIG. 5 fails to show the pixel electrodes in the pixel units in an adjacent column, and the first segment portions 301 and the second segment portions 302 of the two data lines 30 not covered by these pixel electrodes may be covered by the pixel electrodes at two sides in an identical manner. It should be further appreciated that, in the case that the orthogonal projection of the pixel electrode 40 onto the base substrate 10 overlaps the orthogonal projection of the first segment portion 301 of the data line 30 onto the base substrate 10, an edge of the corresponding segment portion of the data line 30 is covered by the pixel electrode 40, or the corresponding segment portion of the data line 30 coincides with an edge of the pixel electrode 40.

A black matrix 02 on a color filter substrate which is arranged opposite to the array substrate 01 further extends to a position between the first segment portion 301 and the second segment portion 302 of the corresponding data line 30. Opposite edges of the black matrix 02 are arranged in proximity to, or coincide with, edges of the first segment portion 301 and the second segment portion 302 of the data line 30 respectively. The black matrix has a width of 2 to 20 μm.

Through the above design, the parasitic capacitors may be formed between each pixel electrode and the adjacent data lines, so as to reduce the occurrence of cross-talk. In addition, each pixel electrode covers a part of the corresponding data line, so as to form the modulation electric field, thereby to prevent the occurrence of light leakage between the adjacent pixel units. Further, the black matrix of the color filter substrate may cover the region between the folded portions of the data line, so as to completely prevent the occurrence of light leakage.

In the embodiments of the present disclosure, the gate lines 21, the gate electrodes g extending from the gate lines 21, the data lines 30, the source electrodes s extending from the data lines 30, the drain electrodes d each arranged opposite to the corresponding source electrode s, the drain electrode pads 31, the drain electrode connection lines 32, the first common electrode lines 20, the second common electrode lines 22 and the common electrode connection line 23 may be made of Cu, Al, Mo, Ti, Cr, W, Nd or Nb, or an alloy thereof.

Each of the above metal lines may be of a single-layered structure, or a multi-layered structure such as Mo/Al/Mo, Ti/Al/Ti, Ti/Cu/Ti or Mo/Cu/Ti. The lines arranged at an identical layer, e.g., the first common electrode lines 20, the second common electrode lines 22, the common electrode connection line 23 and the gate lines 21, may be made of an identical material and have an identical thickness.

Each active layer a may be made of amorphous silicon, low-temperature polycrystalline silicon, or an oxide semiconductor material.

Each insulation layer, e.g., the gate insulation layer, may be made of silicon nitride or silicon oxide. It may be of a single-layered structure, or a multi-layered structure such as silicon oxide/silicon nitride. The protection layer may include the passivation layer and/or the organic material planarization layer. The passivation layer may be made of an inorganic material, such as silicon nitride, and the organic material planarization layer may be made of an organic material such as resin.

Each pixel electrode 40 may be made of a transparent metal oxide conductive material such as ITO, IZO or ITZO.

Through the above design, each pixel unit includes two separate TFTs, and the separate active layers are controlled by the separate gate electrodes respectively, so as to form conductive channels. The TFT at each sub-region includes the separate source electrode and the separate drain electrode. The gate electrodes of the TFTs in the pixel units in each row are connected to an identical gate line, and the source electrodes of the TFTs in the pixel units in each column are connected to an identical data line. Each pixel unit is divided by the corresponding gate line into two sub-regions, each of which is provided with the discontinuous pixel electrode. As a result, it is able to reduce the parasitic capacitor, and increase the storage capacitor by increasing the widths of the drain electrode pads and the portions of the second common electrode lines below the drain electrode pads, thereby to prevent a pixel voltage from being changed due to the existence of a feed-through voltage.

Figure 6:
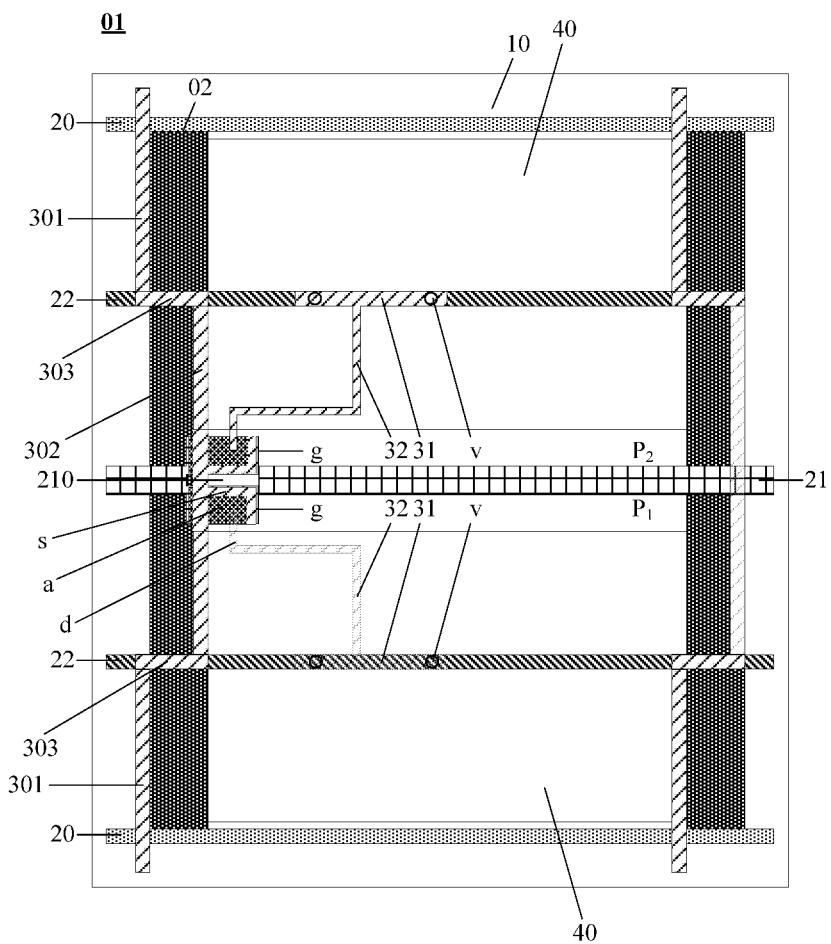
FIG. 6 is still yet another top view of the array substrate according to one embodiment of the present disclosure.

As shown in FIG. 6, the array substrate 01 includes: the first common electrode lines 20, the second common electrode lines 22 and the gate lines 21 arranged on the base substrate 10; the gate insulation layer covering the above lines; and the data lines 30 arranged parallel to each other on the gate insulation layer and spaced apart from each other. The first common electrode lines 20 are arranged parallel to and spaced apart from each other, and each of them has a width of 2 to 30 µm. Each gate line 21 is arranged between every two adjacent first common electrode lines 20 and parallel to the first common electrode lines 20, and has a width of 2 to 50 µm. Each second common electrode line 22 is arranged between one of the first common electrode lines 20 and the adjacent gate line 21 and parallel to the first common electrode lines 20, and has a width of 2 to 30 µm. A lengthwise direction of the data line 30 is perpendicular to the first common electrode lines 20. The first common electrode lines 20 cross the data lines 30 to define the plurality of pixel units P. Each pixel unit P is divided by the gate line 21 located at a substantially central position of the corresponding pixel unit P into two sub-regions P1 and P2 with a substantially identical area.

The TFT is arranged at each sub-region. Each gate line 21 includes two branches located at regions corresponding to the TFTs at the sub-regions and electrically connected to the main portion of the gate line 21, so as to form the gate electrodes g of the TFTs. Each gate electrode g may have a width of 2 to 10 µm, and a length of 2 to 20 µm. The two branches may be arranged substantially parallel to the main portion of the gate line 21, and the hollowed-out portion 210 may be arranged between the two branches.

The two active layers a made of a semiconductor material are arranged on the two branches of the gate line 21 respectively. Each active layer a is separated by the hollowed-out portion 210 on each branch. The active layer a has a width and a length substantially approximate to those of the gate electrode g. The source electrodes s and the drain electrodes d of the TFTs are formed on the active layers a respectively, and the source electrodes s are electrically connected to the data lines 30.

Each sub-region is further provided with the drain electrode pad 31 arranged at a layer identical to the data line 30, the source electrode s and the drain electrode d, and the drain electrode connection lien 32 connected to the drain electrode pad 31 and the drain electrode of the TFT. The drain electrode pad 31 is of a substantially rectangular shape, and arranged above the second common electrode line 22 at the substantially central position of each sub-region. The storage capacitor of each sub-region is formed at a region where the drain electrode pad 31 overlaps the second common electrode line 22.

The drain electrode pad 31 has a width of 2 to 30 µm, and each of the drain electrode d and the drain electrode connection line 32 has a width of 2 to 10 µm. In addition, in order to prevent an aperture ratio of the array substrate from being adversely affected by the non-transparent drain electrode d and drain electrode connection line 32, the width of the drain electrode pad 31 may be greater than the width of each of the drain electrode d and the drain electrode connection line 32.

The array substrate 01 further includes the protection layer covering the source/drain metal layer containing the data lines 30 and the pixel electrodes 40 each arranged at the corresponding sub-region. The via-holes v are formed in the protection layer so as to expose the drain electrode pads 31, and each pixel electrode 40 is connected to the corresponding drain electrode pad 31 through the corresponding via-hole v.

Each data line 30 whose lengthwise direction is perpendicular to the gate line 21 is a folded line. Each data line 30 includes the plurality of first segment portions 301 perpendicular to the first common electrode line 20, the plurality of second segment portions 302 perpendicular to the first common electrode lines 20, and the plurality of third segment portions 303 each connecting the corresponding first segment portion 301 and the corresponding second segment portion 302. With respect to each data line 30, each first segment portion 301 spans over two adjacent pixel units P, and two ends of the first segment portion 301 are respectively located above two adjacent second common electrode lines 22 in the two adjacent pixel units P over which the first segment portion 301 spans; an orthogonal projection of each first segment portion 301 onto the base substrate 10 overlaps an orthogonal projection of the pixel electrode 40 of each pixel unit P at a side of the corresponding data line 30 onto the base substrate 10; each second segment portion 302 spans over the two sub-regions in one pixel unit p, and two ends of the second segment portion 302 are respectively located above the two adjacent second common electrode lines 22 at the two sub-regions; and an orthogonal projection of each second segment portion 302 onto the base substrate 10 overlaps an orthogonal projection of the pixel electrode 40 of each pixel unit P at another side of the data line 30 onto the base substrate. Each segment portion of the data line 30 has a width of 2 to 20 μm.

Here, each third segment portion 303 connecting the first segment portion 301 and the second segment portion 302 may be a straight line perpendicular to, or oblique to, the first segment portion 301 and the second segment portion 302, or a curved line. In order to prevent the aperture ratio of the pixel unit from being adversely affected by the non-transparent data line 30, in some embodiments of the present disclosure, each third segment portion 303 is arranged right above the second common electrode line 22.

The data lines 30 are curved toward an identical direction. In FIG. 6, all the data lines 30 are curved to the right. Between the two data lines at two sides of the pixel units in one column, the pixel electrode 40 at each sub-region covers the second segment portion 302 of the data line 30 at one side (i.e., at the left side), but does not cover the first segment portion 301 of the data line 302. In addition, the pixel electrode 40 at each sub-region of each pixel units in the column covers the first segment portion 301 of the data line at the other side (i.e., the right side), but does not cover the second segment portion 302 of the data line 302.

It should be appreciated that, FIG. 6 fails to show the pixel electrodes in the pixel units in an adjacent column, and the first segment portions 301 and the second segment portions 302 of the two data lines 30 not covered by these pixel electrodes may be covered by the pixel electrodes at two sides in an identical manner. It should be further appreciated that, in the case that the orthogonal projection of the pixel electrode 40 onto the base substrate 10 overlaps the orthogonal projection of the first segment portion 301 of the data line 30 onto the base substrate 10, an edge of the corresponding segment portion of the data line 30 is covered by the pixel electrode 40, or the corresponding segment portion of the data line 30 coincides with an edge of the pixel electrode 40.

A black matrix 02 on a color filter substrate which is arranged opposite to the array substrate 01 further extends to a position between the first segment portion 301 and the second segment portion 302 of the corresponding data line 30. Opposite edges of the black matrix 02 are arranged in proximity to, or coincide with, edges of the first segment portion 301 and the second segment portion 302 of the data line 30 respectively. The black matrix has a width of 2 to 20 μm.

Through the above design, the parasitic capacitors may be formed between each pixel electrode and the adjacent data lines, so as to reduce the occurrence of cross-talk. In addition, each pixel electrode covers a part of the corresponding data line, so as to form the modulation electric field, thereby to prevent the occurrence of light leakage between the adjacent pixel units. Further, the black matrix of the color filter substrate may cover the region between the folded portions of the data line, so as to completely prevent the occurrence of light leakage.

In the embodiments of the present disclosure, the gate lines 21, the gate electrodes g extending from the gate lines 21, the data lines 30, the source electrodes s extending from the data lines 30, the drain electrodes d each arranged opposite to the corresponding source electrode s, the drain electrode pads 31, the drain electrode connection lines 32, the first common electrode lines 20 and the second common electrode lines 22 may be made of Cu, Al, Mo, Ti, Cr, W, Nd or Nb, or an alloy thereof.

Each of the above metal lines may be of a single-layered structure, or a multi-layered structure such as Mo/Al/Mo, Ti/Al/Ti, Ti/Cu/Ti or Mo/Cu/Ti. The lines arranged at an identical layer, e.g., the first common electrode lines 20, the second common electrode lines 22 and the gate lines 21, may be made of an identical material and have an identical thickness.

Each active layer a may be made of amorphous silicon, low-temperature polycrystalline silicon, or an oxide semiconductor material.

Each insulation layer, e.g., the gate insulation layer, may be made of silicon nitride or silicon oxide. It may be of a single-layered structure, or a multi-layered structure such as silicon oxide/silicon nitride. The protection layer may include the passivation layer and/or the organic material planarization layer. The passivation layer may be made of an inorganic material, such as silicon nitride, and the organic material planarization layer may be made of an organic material such as resin.

Each pixel electrode 40 may be made of a transparent metal oxide conductive material such as ITO, IZO or ITZO.

Through the above design, each pixel unit includes two separate TFTs, and the separate active layers are controlled by the separate gate electrodes respectively, so as to form conductive channels. The TFT at each sub-region includes the separate source electrode and the separate drain electrode. The gate electrodes of the TFTs in the pixel units in each row are connected to an identical gate line, and the source electrodes of the TFTs in the pixel units in each column are connected to an identical data line. Each pixel unit is divided by the corresponding gate line into two sub-regions, each of which is provided with the discontinuous pixel electrode. As a result, it is able to reduce the parasitic capacitor, and increase the storage capacitor by increasing the widths of the drain electrode pads and the portions of the second common electrode lines below the drain electrode pads, thereby to prevent a pixel voltage from being changed due to the existence of a feed-through voltage.

Figure 7:
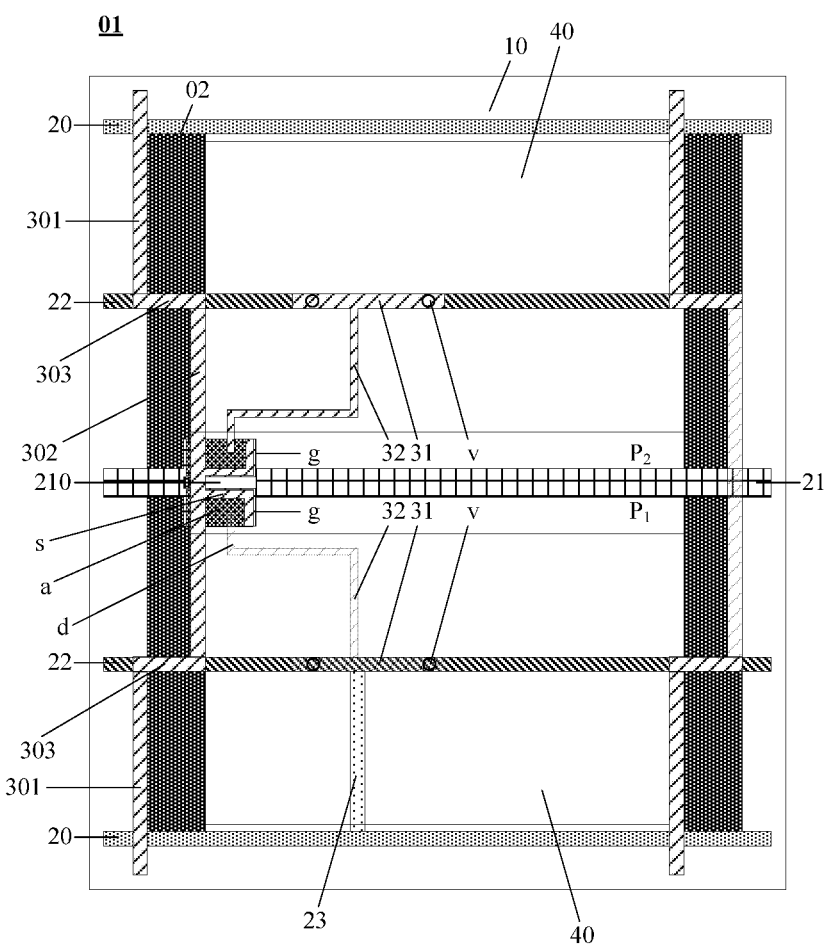
FIG. 7 is still yet another top view of the array substrate according to one embodiment of the present disclosure.

As shown in FIG. 7, the array substrate 01 includes: the first common electrode lines 20, the second common electrode lines 22, the common electrode connection line 23 and the gate lines 21 arranged on the base substrate 10; the gate insulation layer covering the above lines; and the data lines 30 arranged parallel to each other on the gate insulation layer and spaced apart from each other. The first common electrode lines 20 are arranged parallel to and spaced apart from each other, and each of them has a width of 2 to 30 μm. Each gate line 21 is arranged between every two adjacent first common electrode lines 20 and parallel to the first common electrode lines 20, and has a width of 2 to 50 μm. Each second common electrode line 22 is arranged between one of the first common electrode lines 20 and the adjacent gate line 21 and parallel to the first common electrode lines 20, and has a width of 2 to 30 μm. A lengthwise direction of the data line 30 is perpendicular to the first common electrode lines 20. The first common electrode lines 20 cross the data lines 30 to define the plurality of pixel units P. Each pixel unit P is divided by the gate line 21 located at a substantially central position of the corresponding pixel unit P into two sub-regions P1 and P2 with a substantially identical area.

The common electrode connection line 23 is arranged at each sub-region of the pixel unit P and configured to connect the second common electrode line 2 and the adjacent first common electrode line 20. The common electrode connection line 23 may be perpendicular to the first common electrode line 20 and the second common electrode line 22.

The common electrode connection lines 23 at the sub-regions of the pixel units in each row are arranged at an identical side of the corresponding gate line 21, e.g., below the gate line 21 as shown in FIG. 7, i.e., the common electrode connection lines 23 are arranged at the sub-regions P1.

The TFT is arranged at each sub-region. Each gate line 21 includes two branches located at regions corresponding to the TFTs at the sub-regions and electrically connected to the main portion of the gate line 21, so as to form the gate electrodes g of the TFTs. Each gate electrode g may have a width of 2 to 10 μm, and a length of 2 to 20 μm. The two branches may be arranged substantially parallel to the main portion of the gate line 21, and the hollowed-out portion 210 may be arranged between the two branches.

The two active layers a made of a semiconductor material are arranged on the two branches of the gate line 21 respectively. Each active layer a is separated by the hollowed-out portion 210 on each branch. The active layer a has a width and a length substantially approximate to those of the gate electrode g. The source electrodes s and the drain electrodes d of the TFTs are formed on the active layers a respectively, and the source electrodes s are electrically connected to the data lines 30.

Each sub-region is further provided with the drain electrode pad 31 arranged at a layer identical to the data line 30, the source electrode s and the drain electrode d, and the drain electrode connection lien 32 connected to the drain electrode pad 31 and the drain electrode of the TFT. The drain electrode pad 31 is of a substantially rectangular shape, and arranged above the second common electrode line 22 at the substantially central position of each sub-region. The storage capacitor of each sub-region is formed at a region where the drain electrode pad 31 overlaps the second common electrode line 22.

The drain electrode pad 31 has a width of 2 to 30 μm, and each of the drain electrode d and the drain electrode connection line 32 has a width of 2 to 10 μm. In addition, in order to prevent an aperture ratio of the array substrate from being adversely affected by the non-transparent drain electrode d and drain electrode connection line 32, the width of the drain electrode pad 31 may be greater than the width of each of the drain electrode d and the drain electrode connection line 32.

The array substrate 01 further includes the protection layer covering the source/drain metal layer containing the data lines 30 and the pixel electrodes 40 each arranged at the corresponding sub-region. The via-holes v are formed in the protection layer so as to expose the drain electrode pads 31, and each pixel electrode 40 is connected to the corresponding drain electrode pad 31 through the corresponding via-hole v.

Each data line 30 whose lengthwise direction is perpendicular to the gate line 21 is a folded line. Each data line 30 includes the plurality of first segment portions 301 perpendicular to the first common electrode line 20, the plurality of second segment portions 302 perpendicular to the first common electrode lines 20, and the plurality of third segment portions 303 each connecting the corresponding first segment portion 301 and the corresponding second segment portion 302. With respect to each data line 30, each first segment portion 301 spans over two adjacent pixel units P, and two ends of the first segment portion 301 are respectively located above two adjacent second common electrode lines 22 in the two adjacent pixel units P over which the first segment portion 301 spans; an orthogonal projection of each first segment portion 301 onto the base substrate 10 overlaps an orthogonal projection of the pixel electrode 40 of each pixel unit P at a side of the corresponding data line 30 onto the base substrate 10; each second segment portion 302 spans over the two sub-regions in one pixel unit p, and two ends of the second segment portion 302 are respectively located above the two adjacent second common electrode lines 22 at the two sub-regions; and an orthogonal projection of each second segment portion 302 onto the base substrate 10 overlaps an orthogonal projection of the pixel electrode 40 of each pixel unit P at another side of the data line 30 onto the base substrate. Each segment portion of the data line 30 has a width of 2 to 20 μm.

Here, each third segment portion 303 connecting the first segment portion 301 and the second segment portion 302 may be a straight line perpendicular to, or oblique to, the first segment portion 301 and the second segment portion 302, or a curved line. In order to prevent the aperture ratio of the pixel unit from being adversely affected by the non-transparent data line 30, in some embodiments of the present disclosure, each third segment portion 303 is arranged right above the second common electrode line 22.

The data lines 30 are curved toward an identical direction. In FIG. 5, all the data lines 30 are curved to the right. Between the two data lines at two sides of the pixel units in one column, the pixel electrode 40 at each sub-region covers the second segment portion 302 of the data line 30 at one side (i.e., at the left side), but does not cover the first segment portion 301 of the data line 302. In addition, the pixel electrode 40 at each sub-region of each pixel units in the column covers the first segment portion 301 of the data line at the other side (i.e., the right side), but does not cover the second segment portion 302 of the data line 302.

It should be appreciated that, FIG. 5 fails to show the pixel electrodes in the pixel units in an adjacent column, and the first segment portions 301 and the second segment portions 302 of the two data lines 30 not covered by these pixel electrodes may be covered by the pixel electrodes at two sides in an identical manner. It should be further appreciated that, in the case that the orthogonal projection of the pixel electrode 40 onto the base substrate 10 overlaps the orthogonal projection of the first segment portion 301 of the data line 30 onto the base substrate 10, an edge of the corresponding segment portion of the data line 30 is covered by the pixel electrode 40, or the corresponding segment portion of the data line 30 coincides with an edge of the pixel electrode 40.

A black matrix 02 on a color filter substrate which is arranged opposite to the array substrate 01 further extends to a position between the first segment portion 301 and the second segment portion 302 of the corresponding data line 30. Opposite edges of the black matrix 02 are arranged in proximity to, or coincide with, edges of the first segment portion 301 and the second segment portion 302 of the data line 30 respectively. The black matrix has a width of 2 to 20 μm.

Through the above design, the parasitic capacitors may be formed between each pixel electrode and the adjacent data lines, so as to reduce the occurrence of cross-talk. In addition, each pixel electrode covers a part of the corresponding data line, so as to form the modulation electric field, thereby to prevent the occurrence of light leakage between the adjacent pixel units. Further, the black matrix of the color filter substrate may cover the region between the folded portions of the data line, so as to completely prevent the occurrence of light leakage.

In the embodiments of the present disclosure, the gate lines 21, the gate electrodes g extending from the gate lines 21, the data lines 30, the source electrodes s extending from the data lines 30, the drain electrodes d each arranged opposite to the corresponding source electrode s, the drain electrode pads 31, the drain electrode connection lines 32, the first common electrode lines 20, the second common electrode lines 22 and the common electrode connection line 23 may be made of Cu, Al, Mo, Ti, Cr, W, Nd or Nb, or an alloy thereof.

Each of the above metal lines may be of a single-layered structure, or a multi-layered structure such as Mo/Al/Mo, Ti/Al/Ti, Ti/Cu/Ti or Mo/Cu/Ti. The lines arranged at an identical layer, e.g., the first common electrode lines 20, the second common electrode lines 22, the common electrode connection line 23 and the gate lines 21, may be made of an identical material and have an identical thickness.

Each active layer a may be made of amorphous silicon, low-temperature polycrystalline silicon, or an oxide semiconductor material.

Each insulation layer, e.g., the gate insulation layer, may be made of silicon nitride or silicon oxide. It may be of a single-layered structure, or a multi-layered structure such as silicon oxide/silicon nitride. The protection layer may include the passivation layer and/or the organic material planarization layer. The passivation layer may be made of an inorganic material, such as silicon nitride, and the organic material planarization layer may be made of an organic material such as resin.

Each pixel electrode 40 may be made of a transparent metal oxide conductive material such as ITO, IZO or ITZO.

Through the above design, each pixel unit includes two separate TFTs, and the separate active layers are controlled by the separate gate electrodes respectively, so as to form conductive channels. The TFT at each sub-region includes the separate source electrode and the separate drain electrode. The gate electrodes of the TFTs in the pixel units in each row are connected to an identical gate line, and the source electrodes of the TFTs in the pixel units in each column are connected to an identical data line. Each pixel unit is divided by the corresponding gate line into two sub-regions, each of which is provided with the discontinuous pixel electrode. As a result, it is able to reduce the parasitic capacitor, and increase the storage capacitor by increasing the widths of the drain electrode pads and the portions of the second common electrode lines below the drain electrode pads, thereby to prevent a pixel voltage from being changed due to the existence of a feed-through voltage.

Figure 8:
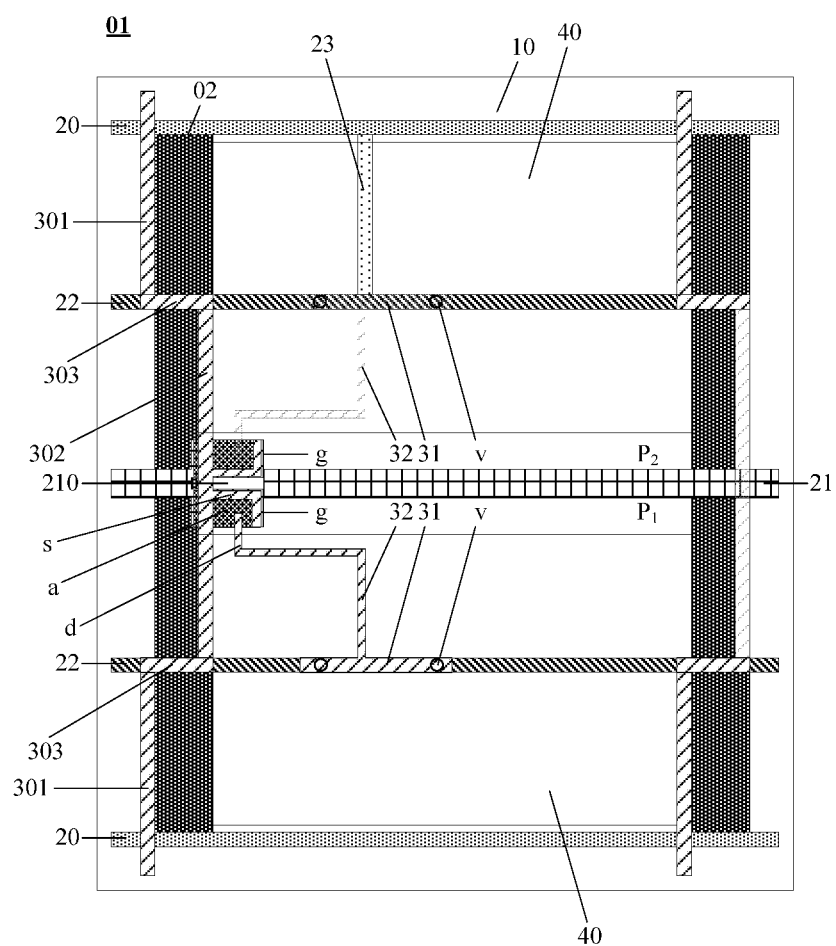
FIG. 8 is still yet another top view of the array substrate according to one embodiment of the present disclosure.

As shown in FIG. 8, the array substrate 01 includes: the first common electrode lines 20, the second common electrode lines 22, the common electrode connection line 23 and the gate lines 21 arranged on the base substrate 10; the gate insulation layer covering the above lines; and the data lines 30 arranged parallel to each other on the gate insulation layer and spaced apart from each other. The first common electrode lines 20 are arranged parallel to and spaced apart from each other, and each of them has a width of 2 to 30 μm. Each gate line 21 is arranged between every two adjacent first common electrode lines 20 and parallel to the first common electrode lines 20, and has a width of 2 to 50 μm. Each second common electrode line 22 is arranged between one of the first common electrode lines 20 and the adjacent gate line 21 and parallel to the first common electrode lines 20, and has a width of 2 to 30 μm. A lengthwise direction of the data line 30 is perpendicular to the first common electrode lines 20. The first common electrode lines 20 cross the data lines 30 to define the plurality of pixel units P. Each pixel unit P is divided by the gate line 21 located at a substantially central position of the corresponding pixel unit P into two sub-regions P1 and P2 with a substantially identical area.

The common electrode connection line 23 is arranged at each sub-region of the pixel unit P and configured to connect the second common electrode line 2 and the adjacent first common electrode line 20. The common electrode connection line 23 may be perpendicular to the first common electrode line 20 and the second common electrode line 22.

The common electrode connection lines 23 at the sub-regions of the pixel units in each row are arranged at an identical side of the corresponding gate line 21, e.g., above the gate line 21 as shown in FIG. 8, i.e., the common electrode connection lines 23 are arranged at the sub-regions P2, different from the arrangement mode in FIG. 7.

The TFT is arranged at each sub-region. Each gate line 21 includes two branches located at regions corresponding to the TFTs at the sub-regions and electrically connected to the main portion of the gate line 21, so as to form the gate electrodes g of the TFTs. Each gate electrode g may have a width of 2 to 10 μm, and a length of 2 to 20 μm. The two branches may be arranged substantially parallel to the main portion of the gate line 21, and the hollowed-out portion 210 may be arranged between the two branches.

The two active layers a made of a semiconductor material are arranged on the two branches of the gate line 21 respectively. Each active layer a is separated by the hollowed-out portion 210 on each branch. The active layer a has a width and a length substantially approximate to those of the gate electrode g. The source electrodes s and the drain electrodes d of the TFTs are formed on the active layers a respectively, and the source electrodes s are electrically connected to the data lines 30.

Each sub-region is further provided with the drain electrode pad 31 arranged at a layer identical to the data line 30, the source electrode s and the drain electrode d, and the drain electrode connection lien 32 connected to the drain electrode pad 31 and the drain electrode of the TFT. The drain electrode pad 31 is of a substantially rectangular shape, and arranged above the second common electrode line 22 at the substantially central position of each sub-region. The storage capacitor of each sub-region is formed at a region where the drain electrode disc 31 overlaps the second common electrode line 22.

The drain electrode disc 31 has a width of 2 to 30 μm, and each of the drain electrode d and the drain electrode connection line 32 has a width of 2 to 10 μm. In addition, in order to prevent an aperture ratio of the array substrate from being adversely affected by the non-transparent drain electrode d and drain electrode connection line 32, the width of the drain electrode disc 31 shall be greater than the width of each of the drain electrode d and the drain electrode connection line 32.

The array substrate 01 further includes the protection layer covering the source/drain metal layer containing the data lines 30 and the pixel electrodes 40 each arranged at the corresponding sub-region. The via-holes v are formed in the protection layer so as to expose the drain electrode discs 31, and each pixel electrode 40 is connected to the corresponding drain electrode disc 31 through the corresponding via-hole v.

Each data line 30 whose lengthwise direction is perpendicular to the gate line 21 is a folded line. Each data line 30 includes the plurality of first segment portions 301 perpendicular to the first common electrode line 20, the plurality of second segment portions 302 perpendicular to the first common electrode lines 20, and the plurality of third segment portions 303 each connecting the corresponding first segment portion 301 and the corresponding second segment portion 302. With respect to each data line 30, each first segment portion 301 spans over two adjacent pixel units P, and two ends of the first segment portion 301 are respectively located above two adjacent second common electrode lines 22 in the two adjacent pixel units P over which the first segment portion 301 spans; an orthogonal projection of each first segment portion 301 onto the base substrate 10 overlaps an orthogonal projection of the pixel electrode 40 of each pixel unit P at a side of the corresponding data line 30 onto the base substrate 10; each second segment portion 302 spans over the two sub-regions in one pixel unit p, and two ends of the second segment portion 302 are respectively located above the two adjacent second common electrode lines 22 at the two sub-regions; and an orthogonal projection of each second segment portion 302 onto the base substrate 10 overlaps an orthogonal projection of the pixel electrode 40 of each pixel unit P at another side of the data line 30 onto the base substrate. Each segment portion of the data line 30 has a width of 2 to 20 μm.

Here, each third segment portion 303 connecting the first segment portion 301 and the second segment portion 302 may be a straight line perpendicular to, or oblique to, the first segment portion 301 and the second segment portion 302, or a curved line. In order to prevent the aperture ratio of the pixel unit from being adversely affected by the non-transparent data line 30, in some embodiments of the present disclosure, each third segment portion 303 is arranged right above the second common electrode line 22.

The data lines 30 are curved toward an identical direction. In FIG. 5, all the data lines 30 are curved to the right. Between the two data lines at two sides of the pixel units in one column, the pixel electrode 40 at each sub-region covers the second segment portion 302 of the data line 30 at one side (i.e., at the left side), but does not cover the first segment portion 301 of the data line 302. In addition, the pixel electrode 40 at each sub-region of each pixel units in the column covers the first segment portion 301 of the data line at the other side (i.e., the right side), but does not cover the second segment portion 302 of the data line 30.

It should be appreciated that, FIG. 5 fails to show the pixel electrodes in the pixel units in an adjacent column, and the first segment portions 301 and the second segment portions 302 of the two data lines 30 not covered by these pixel electrodes may be covered by the pixel electrodes at two sides in an identical manner. It should be further appreciated that, in the case that the orthogonal projection of the pixel electrode 40 onto the base substrate 10 overlaps the orthogonal projection of the first segment portion 301 of the data line 30 onto the base substrate 10, an edge of the corresponding segment portion of the data line 30 is covered by the pixel electrode 40, or the corresponding segment portion of the data line 30 coincides with an edge of the pixel electrode 40.

A black matrix 02 on a color filter substrate which is arranged opposite to the array substrate 01 further extends to a position between the first segment portion 301 and the second segment portion 302 of the corresponding data line 30. Opposite edges of the black matrix 02 are arranged in proximity to, or coincide with, edges of the first segment portion 301 and the second segment portion 302 of the data line 30 respectively. The black matrix has a width of 2 to 20 μm.

Through the above design, the parasitic capacitors may be formed between each pixel electrode and the adjacent data lines, so as to reduce the occurrence of cross-talk. In addition, each pixel electrode covers a part of the corresponding data line, so as to form the modulation electric field, thereby to prevent the occurrence of light leakage between the adjacent pixel units. Further, the black matrix of the color filter substrate may cover the region between the folded portions of the data line, so as to completely prevent the occurrence of light leakage.

In the embodiments of the present disclosure, the gate lines 21, the gate electrodes g extending from the gate lines 21, the data lines 30, the source electrodes s extending from the data lines 30, the drain electrodes d each arranged opposite to the corresponding source electrode s, the drain electrode pads 31, the drain electrode connection lines 32, the first common electrode lines 20, the second common electrode lines 22 and the common electrode connection line 23 may be made of Cu, Al, Mo, Ti, Cr, W, Nd or Nb, or an alloy thereof.

Each of the above metal lines may be of a single-layered structure, or a multi-layered structure such as Mo/Al/Mo, Ti/Al/Ti, Ti/Cu/Ti or Mo/Cu/Ti. The lines arranged at an identical layer, e.g., the first common electrode lines 20, the second common electrode lines 22, the common electrode connection line 23 and the gate lines 21, may be made of an identical material and have an identical thickness.

Each active layer a may be made of amorphous silicon, low-temperature polycrystalline silicon, or an oxide semiconductor material.

Each insulation layer, e.g., the gate insulation layer, may be made of silicon nitride or silicon oxide. It may be of a single-layered structure, or a multi-layered structure such as silicon oxide/silicon nitride. The protection layer may include the passivation layer and/or the organic material planarization layer. The passivation layer may be made of an inorganic material, such as silicon nitride, and the organic material planarization layer may be made of an organic material such as resin.

Each pixel electrode 40 may be made of a transparent metal oxide conductive material such as ITO, IZO or ITZO.

Through the above design, each pixel unit includes two separate TFTs, and the separate active layers are controlled by the separate gate electrodes respectively, so as to form conductive channels. The TFT at each sub-region includes the separate source electrode and the separate drain electrode. The gate electrodes of the TFTs in the pixel units in each row are connected to an identical gate line, and the source electrodes of the TFTs in the pixel units in each column are connected to an identical data line. Each pixel unit is divided by the corresponding gate line into two sub-regions, each of which is provided with the discontinuous pixel electrode. As a result, it is able to reduce the parasitic capacitor, and increase the storage capacitor by increasing the widths of the drain electrode pads and the portions of the second common electrode lines below the drain electrode pads, thereby to prevent a pixel voltage from being changed due to the existence of a feed-through voltage.

As mentioned above, the data lines in the third to sixth embodiments of the present disclosure are arranged in a manner difference from those in the first and second embodiments of the present disclosure, i.e., in the third to sixth embodiments of the present disclosure, each data line is a folded line. Through this design, the parasitic capacitors may be formed between each pixel electrode and the adjacent data lines, so as to reduce the occurrence of cross-talk. In addition, each pixel electrode covers a part of the corresponding data line, so as to form the modulation electric field, thereby to prevent the occurrence of light leakage between the adjacent pixel units. Further, the black matrix of the color filter substrate may cover the region between the folded portions of the data line, so as to completely prevent the occurrence of light leakage.

The present disclosure further provides in some embodiments a display device including the above-mentioned array substrate 01 and other elements, such as a liquid crystal layer, a color filter substrate and a power source.

The display device may be any product or member having a display function, such as a liquid crystal display, a liquid crystal television, an organic light-emitting diode (OLED) display, an OLED television, a flat-panel computer, a mobile phone, a digital photo frame or a navigator.

It should be appreciated that, in the above embodiments of the present disclosure the source electrode of each TFT is connected to the data lien and the drain electrode thereof is electrically connected to the pixel electrode. However, the source electrode and the drain electrode of the TFT may be replaced with each other, so the drain electrode of the TFT may be connected to the data line and the source electrode thereof may be electrically connected to the pixel electrode.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising:
   a plurality of first common electrode lines arranged parallel to each other on a base substrate and spaced apart from each other;
   a plurality of gate lines each arranged between two adjacent first common electrode lines and parallel to the first common electrode lines;
   a gate insulation layer covering the first common electrode lines and the gate lines;
   a plurality of data lines arranged parallel to each other on the gate insulation layer and spaced apart from each other, the first common electrode lines crossing the data lines to define a plurality of pixel units, each gate line dividing a corresponding pixel unit into two sub-regions, a separate thin film transistor (TFT) being arranged at each sub-region;
   a plurality of second common electrode lines each arranged between one first common electrode line and an adjacent gate line and at a layer identical to the first common electrode lines;
   a drain electrode pad arranged at each sub-region and a drain electrode connection line for connecting the drain electrode pad to a drain electrode of the TFT, the drain electrode pad, the drain electrode connection line and the drain electrode being arranged at an identical layer,
   a protection layer covering a source/drain metal layer; and
   a plurality of pixel electrodes arranged in one-to-one correspondence with the sub-regions and arranged so as not to contact each other,
   wherein:
   an orthogonal projection of each second common electrode line onto the base substrate overlaps an orthogonal projection of the drain electrode pad onto the base substrate,
   each pixel electrode is electrically connected to the drain electrode of the TFT,
   an orthogonal projection of each pixel electrode onto the base substrate is at least partially located within an orthogonal projection of the sub-region onto the base substrate,
   a via-hole is formed in the protection layer so as to expose the drain electrode pad, and
   each pixel electrode is connected to the corresponding drain electrode pad through the via-hole.

2. The array substrate according to claim 1, wherein each second common electrode line is arranged parallel to the first common electrode lines.

3. The array substrate according to claim 1, wherein the orthogonal projection of each pixel electrode onto the base substrate overlaps orthogonal projections of the data lines at both sides of the pixel electrode onto the base substrate.

4. The array substrate according to claim 3, wherein each data line comprises a plurality of first segment portions perpendicular to the first common electrode line, a plurality of second segment portions perpendicular to the first common electrode lines, and a plurality of third segment portions each connecting the corresponding first segment portion and the corresponding second segment portion, and wherein:
   with respect to each data line, each first segment portion spans over two adjacent pixel units, and two ends of the first segment portion are respectively located at two sides of the first common electrode line over which the first segment portion spans;
   an orthogonal projection of each first segment portion onto the base substrate overlaps an orthogonal projection of the pixel electrode of each pixel unit at a first side of the corresponding data line onto the base substrate;
   each second segment portion spans over a corresponding gate line crossing the corresponding data line, and two ends of the second segment portion are respectively located at two sides of the gate line; and
   an orthogonal projection of each second segment portion onto the base substrate overlaps an orthogonal projection of the pixel electrode of each pixel unit at a second side of the corresponding data line onto the base substrate.

5. The array substrate according to claim 4, wherein each third segment portion is angled relative to the corresponding second common electrode line, and the corresponding third segment portions at the two ends of each second segment portion are arranged symmetrically relative to the corresponding gate line over which the second segment portion spans.

6. The array substrate according to claim 4, wherein an orthogonal projection of each third segment portion onto the base substrate is located within an orthogonal projection of the corresponding second common electrode line onto the base substrate.

7. The array substrate according to claim 4, further comprising a common electrode connection line arranged within at least one pixel unit, wherein the common electrode connection line is arranged at a layer identical to the first common electrode lines and the second common electrode lines and connects the corresponding second common electrode line to the adjacent first common electrode line, and
   the common electrode connection line within the at least one pixel unit is located at one or two sub-regions.

8. The array substrate according to claim 1, wherein the protection layer comprises a passivation layer, an organic material planarization layer, or both.

9. The array substrate according to claim 1, wherein active layers of the TFTs are separated from each other.

10. The array substrate according to claim 1, further comprising a common electrode connection line arranged within at least one pixel unit, wherein the common electrode connection line is arranged at a layer identical to the first common electrode lines and the second common electrode lines and connects the corresponding second common electrode line to the adjacent first common electrode line, and the common electrode connection line within the at least one pixel unit is located at one or two sub-regions.

11. The array substrate according to claim 1, wherein the two sub-regions of each pixel unit divided by the gate line have an identical area.

12. The array substrate according to claim 1, wherein a plurality of gate electrodes extends from two sides of each gate line and is located at the sub-regions respectively, each of the gate lines is provided with a plurality of hollowed-out portions, and each of the hollowed-out portions is located between two gate electrodes opposite to each other, and extends to be below a corresponding data line crossing the gate line.

13. The array substrate according to claim 1, wherein the drain electrode pad has a width greater than or equal to the drain electrode and the drain electrode connection line, and/or the drain electrode pad has a width equal to the second common electrode line.

14. A display device, comprising the array substrate according to claim 1.

15. An array substrate, comprising:
a plurality of first common electrode lines arranged parallel to each other on a base substrate and spaced apart from each other;
a plurality of gate lines each arranged between two adjacent first common electrode lines and parallel to the first common electrode lines;
a gate insulation layer covering the first common electrode lines and the gate lines;
a plurality of data lines arranged parallel to each other on the gate insulation layer and spaced apart from each other, the first common electrode lines crossing the data lines to define a plurality of pixel units, each gate line dividing a corresponding pixel unit into two sub-regions, a separate thin film transistor (TFT) being arranged at each sub-region;
a plurality of second common electrode lines each arranged between one first common electrode line and an adjacent gate line and at a layer identical to the first common electrode lines;
a drain electrode pad arranged at each sub-region and a drain electrode connection line for connecting the drain electrode pad to a drain electrode of the TFT, the drain electrode pad, the drain electrode connection line and the drain electrode being arranged at an identical layer, wherein:
an orthogonal projection of each second common electrode line onto the base substrate overlaps an orthogonal projection of the drain electrode pad onto the base substrate, and
a plurality of gate electrodes extends from two sides of each gate line and is located at the sub-regions respectively, each of the gate lines is provided with a plurality of hollowed-out portions, and each of the hollowed-out portions is located between two gate electrodes opposite to each other, and extends to be below a corresponding data line crossing the gate line.

* * * * *